US009524755B1

(12) United States Patent
Naito et al.

(10) Patent No.: US 9,524,755 B1
(45) Date of Patent: Dec. 20, 2016

(54) SEMICONDUCTOR MEMORY DEVICE AND METHOD FOR DRIVING THE SAME

(71) Applicant: Kabushiki Kaisha Toshiba, Minato-ku (JP)

(72) Inventors: Shinya Naito, Toyota (JP); Mitsutoshi Nakamura, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/008,671

(22) Filed: Jan. 28, 2016

Related U.S. Application Data

(60) Provisional application No. 62/213,814, filed on Sep. 3, 2015.

(51) Int. Cl.
| | | |
|---|---|---|
| G11C 16/04 | (2006.01) | |
| G11C 5/02 | (2006.01) | |
| H01L 27/115 | (2006.01) | |
| G11C 7/12 | (2006.01) | |

(52) U.S. Cl.
CPC ............ G11C 5/025 (2013.01); G11C 7/12 (2013.01); H01L 27/11582 (2013.01)

(58) Field of Classification Search
USPC .......... 365/185.17, 185.18, 185.26; 257/326, 257/390, 324
See application file for complete search history.

(56) References Cited

U.S. PATENT DOCUMENTS

| | | | | |
|---|---|---|---|---|
| 7,969,789 | B2 * | 6/2011 | Katsumata | .......... G11C 11/5671 365/185.17 |
| 8,053,829 | B2 * | 11/2011 | Kang | .................... H01L 27/115 257/324 |
| 8,351,277 | B2 | 1/2013 | Mikajiri et al. | |
| 8,837,225 | B2 | 9/2014 | Higuchi et al. | |
| 2013/0107602 | A1 | 5/2013 | Oh et al. | |

FOREIGN PATENT DOCUMENTS

JP          5248541 B2     7/2013

* cited by examiner

*Primary Examiner* — Vu Le
(74) *Attorney, Agent, or Firm* — Oblon, McClelland, Maier & Neustadt, L.L.P.

(57) ABSTRACT

A semiconductor memory device includes a semiconductor substrate, a stacked body provided on the semiconductor substrate, a semiconductor pillar and an electrode member provided inside the stacked body, a charge storage film, and a control circuit. The stacked body includes insulating films and electrode films stacked alternately. The semiconductor pillar and the electrode member extend in a stacking direction and lower ends thereof are connected to the semiconductor substrate. The charge storage film is provided between the semiconductor pillar and one of the electrode films. The control circuit sets an upper end of the semiconductor pillar to a floating state, applies a first potential to the semiconductor substrate, applies a second potential to the electrode member, and applies a third potential to the one of the electrode films. The second potential is lower than the first potential. The third potential is lower than the second potential.

20 Claims, 6 Drawing Sheets

(SOURCE POTENTIAL=Vera)

(SOURCE POTENTIAL=Vera - α)

(SOURCE POTENTIAL=Vera)

(SOURCE POTENTIAL=Vera+α)

SEMICONDUCTOR MEMORY DEVICE AND METHOD FOR DRIVING THE SAME

CROSS-REFERENCE TO RELATED APPLICATIONS

This application is based upon and claims the benefit of priority from U.S. Provisional Patent Application 62/213,814, filed on Sep. 3, 2015; the entire contents of which are incorporated herein by reference.

FIELD

Embodiments relate to a semiconductor memory device and a method for driving the same.

BACKGROUND

In recent years, a stacked type semiconductor memory device has been proposed in which memory cells are integrated three-dimensionally. In such a stacked type semiconductor memory device, a stacked body in which electrode films and insulating films are stacked alternately is provided on a semiconductor substrate; and semiconductor pillars that pierce the stacked body are provided. Also, memory cells are formed at each intersection between the electrode films and the semiconductor pillars. It is a challenge to increase the operation speed for such a semiconductor memory device.

DETAILED DESCRIPTION

A semiconductor memory device according to an embodiment, includes a semiconductor substrate, a stacked body provided on the semiconductor substrate, a semiconductor pillar provided inside the stacked body, a charge storage film, an electrode member provided inside the stacked body, and a control circuit. The stacked body includes insulating films and electrode films. Each of the insulating films and each of the electrode films are stacked alternately in the stacked body. The semiconductor pillar extends in a stacking direction of the insulating films and the electrode films. A lower end of the semiconductor pillar is connected to the semiconductor substrate. The charge storage film is provided between the semiconductor pillar and one of the electrode films. The electrode member extends in the stacking direction. A lower end of the electrode member is connected to the semiconductor substrate. The control circuit sets an upper end of the semiconductor pillar to a floating state, applies a first potential to the semiconductor substrate, applies a second potential to the electrode member, and applies a third potential to the one of the electrode films. The second potential is lower than the first potential. The third potential is lower than the second potential.

Embodiments the invention will now be described with reference to the drawings.

First Embodiment

Figure 1:
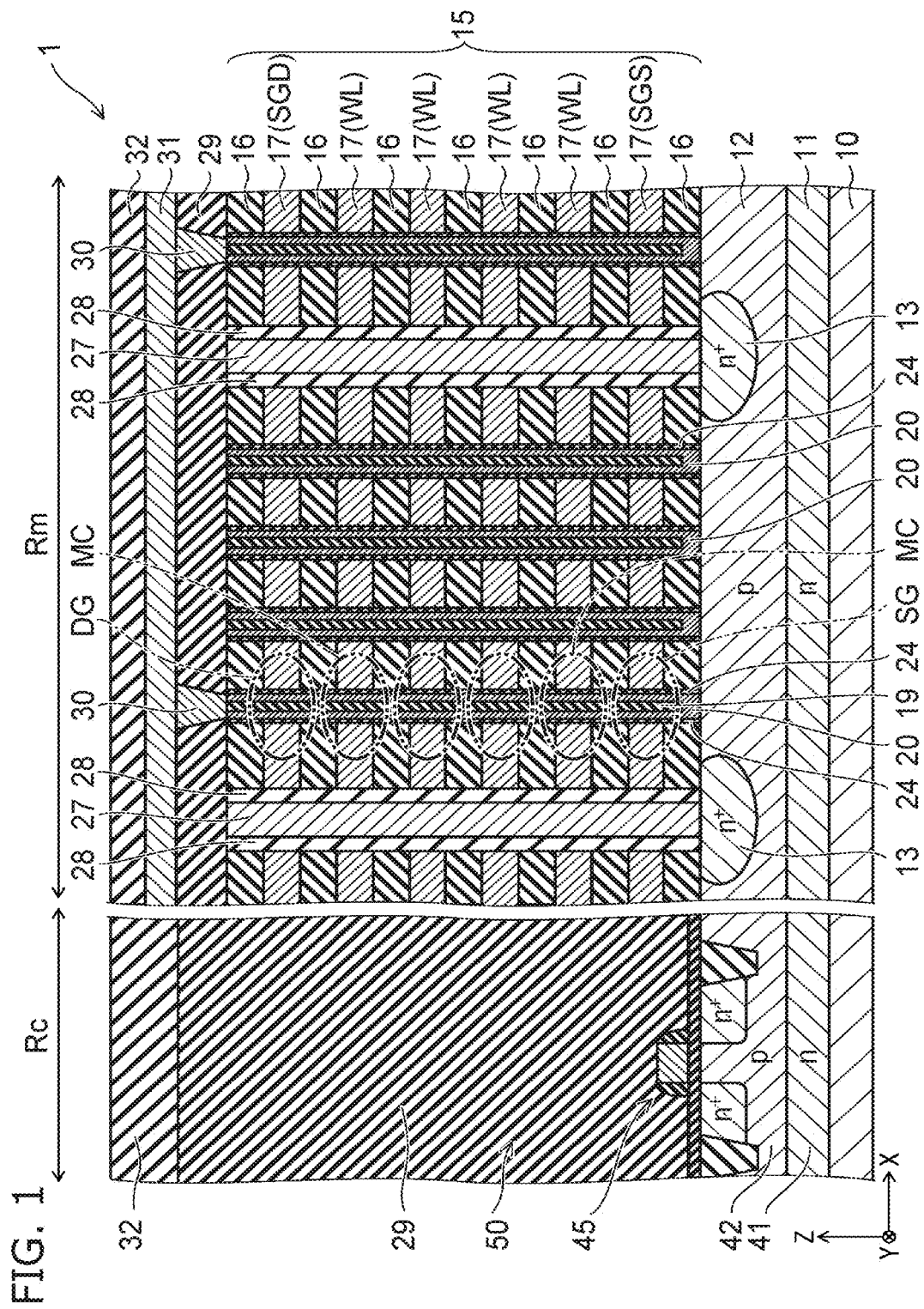
FIG. 1 is a cross-sectional view showing a semiconductor memory device according to a first embodiment.

First, a first embodiment will be described.
<Configuration>
FIG. 1 is a cross-sectional view showing a semiconductor memory device according to the embodiment.

Figure 2:
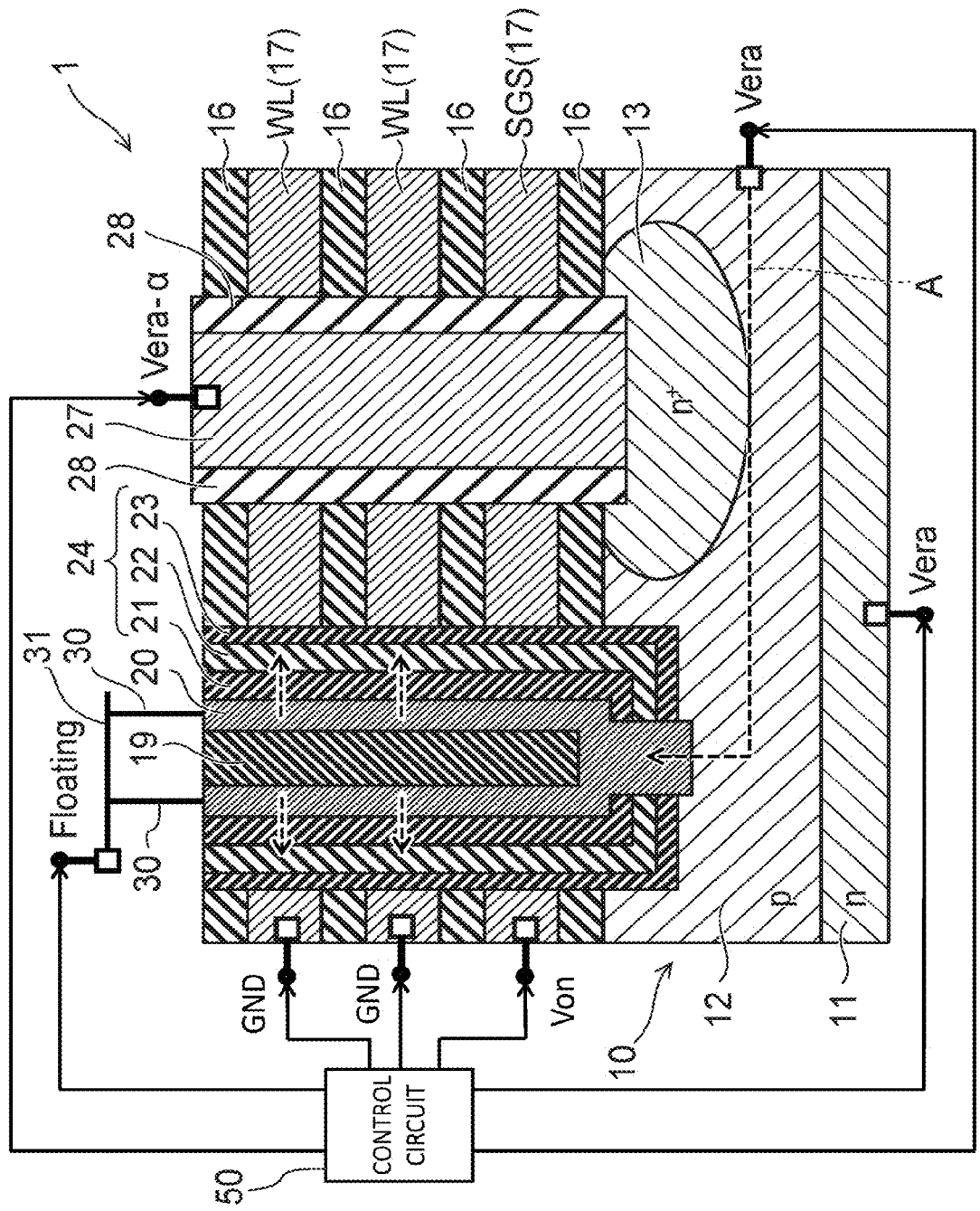
FIG. 2 is a drawing schematically showing the semiconductor memory device according to the first embodiment.

FIG. 2 is a drawing schematically showing the semiconductor memory device according to the embodiment.

The potentials of the portions recited in FIG. 2 are the potentials applied in an erasing operation described below.

As shown in FIG. 1 and FIG. 2, a silicon substrate 10 is provided in the semiconductor memory device 1 according to the embodiment. Hereinbelow, an XYZ orthogonal coordinate system is employed for convenience of description in the specification. Two mutually-orthogonal directions parallel to the upper surface of the silicon substrate 10 are taken as an "X-direction" and a "Y-direction;" and a direction perpendicular to the upper surface of the silicon substrate 10 is taken as a "Z-direction."

A memory array region Rm and a peripheral circuit region Rc are set in the silicon substrate 10. In the memory array region Rm, memory cells MC that are described below are disposed and can store data. In the peripheral circuit region Rc, a control circuit 50 that is described below is provided and can store data, read data, and erase data to and from any memory cell by inputting and outputting signals to and from the memory array region.

In the memory array region Rm, an n-type well 11 that has a conductivity type of an n-type is provided in the upper layer portion of the silicon substrate 10. A p-type well 12 that has a conductivity type of a p-type is provided in a portion on the n-type well 11. An $n^+$-type diffusion layer 13 that has a conductivity type of the n-type is provided in a portion on the p-type well 12. The p-type well 12 covers the side surface and lower surface of the $n^+$-type diffusion layer 13. The $n^+$-type diffusion layer 13 is separated from the n-type well 11 by the p-type well 12. The effective impurity concentration of the $n^+$-type diffusion layer 13 is higher than the effective impurity concentration of the n-type well 11. The effective impurity concentration refers to the concentration of the impurities contributing to the conductivity of the semiconductor material, and in the case where both an impurity that forms donors and an impurity that forms acceptors are included, refers to the concentration excluding the cancelled portion of the donors and the acceptors. The effective impurity concentration is equal to the carrier concentration. Also, the silicon substrate 10 that includes the n-type well 11, the p-type well 12, and the $n^+$-type diffusion layer 13 is formed, as an entirety, of a monocrystal of silicon.

A stacked body 15 is provided on the silicon substrate 10. Insulating films 16 and electrode films 17 are stacked alternately along the Z-direction in the stacked body 15. The insulating film 16 is made of, for example, silicon oxide; and in the electrode film 17, for example, a barrier metal layer made of titanium nitride is formed on the surface of a main body unit made of tungsten. The electrode film 17 that is disposed at the lowermost level is used as a source-side selection gate electrode SGS; the electrode film 17 that is disposed at the uppermost level is used as a drain-side selection gate electrode SGD; and the other electrode films 17 are used as word lines WL. Multiple levels may be provided for the source-side selection gate electrode SGS and for the drain-side selection gate electrode SGD.

A silicon pillar 20 that extends in the Z-direction is provided inside the stacked body 15. The silicon pillar 20 is made of, for example, polysilicon; and the configuration of the silicon pillar 20 is a circular tube in which the lower end is plugged. The lower end of the silicon pillar 20 is connected to the p-type well 12 of the silicon substrate 10. A core member 19 that is made of, for example, silicon oxide is provided inside the silicon pillar 20.

A tunneling insulating film 21 is provided on the side surface of the silicon pillar 20. Although the tunneling insulating film 21 normally is insulative, the tunneling insulating film 21 is a film in which a tunneling current flows when a prescribed voltage within the range of the drive voltage of the semiconductor memory device 1 is applied and is, for example, a single-layer silicon oxide film or an ONO film in which a silicon oxide layer, a silicon nitride layer, and a silicon oxide layer are stacked. A charge storage film 22 is provided on the tunneling insulating film 21. The charge storage film 22 is a film that can store charge, is formed of, for example, a material that has trap sites of electrons, and is formed of, for example, silicon nitride ($Si_3N_4$). A blocking insulating film 23 is provided on the charge storage film 22. The blocking insulating film 23 is a film in which a current substantially does not flow even when a voltage within the range of the drive voltage of the semiconductor memory device 1 is applied. The blocking insulating film 23 is, for example, a single-layer silicon oxide film or a three-layer film in which a silicon oxide layer, an aluminum oxide layer, and a silicon oxide layer are stacked. A memory film 24 that is capable of storing data includes the tunneling insulating film 21, the charge storage film 22, and the blocking insulating film 23. Accordingly, the memory film 24 is disposed between the silicon pillar 20 and the electrode films 17.

In the memory array region, the memory cell transistor MC is configured, via the memory film 24, at each intersection between the silicon pillars 20 and the word lines WL. Thereby, the memory cell transistors MC are arranged in a three-dimensional matrix configuration. Also, a source-side selection transistor SG is configured at the intersections between the source-side selection gate electrode SGS and the silicon pillars 20; and a drain-side selection transistor DG is configured at the intersections between the drain-side selection gate electrode SGD and the silicon pillars 20.

A source electrode 27 that has a plate configuration is provided inside the stacked body 15. The source electrode 27 pierces the stacked body 15 in the Z-direction and extends in the Y-direction. The lower end of the source electrode 27 is connected to the $n^+$-type diffusion layer 13 of the silicon substrate 10. For example, insulating plates 28 that are made of silicon oxide are provided on the two side surfaces of the source electrode 27.

Also, an insulating film 29 is provided on the stacked body 15; and plugs 30 are provided inside the insulating film 29. Bit lines 31 that extend in the X-direction are provided on the insulating film 29. The bit lines 31 are connected to the upper ends of the silicon pillars 20 via the plugs 30. An insulating film 32 is provided on the bit lines 31.

The silicon pillars 20 are connected between the bit lines 31 and the silicon substrate 10. Also, the multiple memory cell transistors MC are connected in series along each of the silicon pillars 20; and the source-side selection transistor SG and the drain-side selection transistor DG are connected at the two ends of the multiple memory cell transistors MC. Thereby, a NAND string is formed in which the drain-side selection transistor DG, the multiple memory cell transistors MC, and the source-side selection transistor SG are connected in series between the bit line 31 and the silicon substrate 10.

On the other hand, in the peripheral circuit region Rc, an n-type well 41 is provided in the upper layer portion of the silicon substrate 10. The n-type well 41 is separated from the n-type well 11. A p-type well 42 is provided in a portion on the n-type well 41. An n-channel transistor 45 is formed in the upper layer portion of the p-type well 42 and on the silicon substrate 10. Also, in the peripheral circuit region Rc, the control circuit 50 that includes the n-channel transistor 45 is formed in the upper layer portion of the silicon substrate 10 and on the silicon substrate 10.

The control circuit 50 applies prescribed potentials to the n-type well 11, the p-type well 12, the source electrode 27, the source-side selection gate electrode SGS, the word lines WL, the drain-side selection gate electrode SGD, and the bit line 31 of the memory array region Rm. Also, the control circuit 50 measures the current flowing in the bit line 31.

<Driving Method>

Operations of the semiconductor memory device 1 according to the embodiment, i.e., a method for driving the semiconductor memory device, will now be described.

<Programming Operation>

First, a programming operation of data in which electrons are injected into any memory cell will be described briefly.

The control circuit 50 applies an ON potential to the source-side selection gate electrode SGS and the drain-side selection gate electrode SGD of the NAND string including the memory cell to be programmed to switch the source-side selection transistor SG and the drain-side selection transistor DG to an ON state. Then, the potential of the silicon pillar 20 is set to a ground potential by, for example, applying a ground potential GND to the source electrode 27 and the bit line 31. On the other hand, a positive programming potential is applied to the word line WL to be selected; and the ON potential is applied to the unselected word lines WL. The programming potential is higher than the ON potential. Thereby, in the memory cell MC to be programmed, the electrons inside the silicon pillar 20 are injected into the charge storage film 22 via the tunneling insulating film 21; and the data is programmed.

<Read Operation>

A read operation of data to determine whether or not the electrons are injected into any memory cell will now be described briefly.

The control circuit 50 applies, to the word line WL included in the memory cell to be read, a read-out potential such that it can be known whether the memory cell is switched to the ON state or switched to the OFF state by whether or not electrons are stored in the charge storage film 22. Also, the ON potential is applied to the other word lines WL. In this state, a potential that is slightly higher than that of the source electrode 27 is applied to the bit line 31. Then, the control circuit 50 determines whether or not charge is stored in the memory cell to be read by sensing the current flowing in the source electrode 27 from the bit line 31. At this time, by the $n^+$-type diffusion layer 13 being formed in the silicon substrate 10, the contact resistance between the silicon substrate 10 and the source electrode 27 decreases; and the current flows more easily from the bit line 31 toward the source electrode 27.

<Erasing Operation>

An erasing operation of data in which the electrons injected into the memory cells are erased will now be described.

As shown in FIG. 2, the control circuit 50 sets the bit line itself to the floating state, or switches the drain-side selection transistor DG to the OFF state by applying the OFF potential to the drain-side selection gate electrode SGD. Thereby, the upper end portion of the silicon pillar 20 is set to the floating state. Also, the source-side selection transistor SG is switched to the ON state by applying the ON potential to the source-side selection gate electrode SGS. In this state, the control circuit 50 applies a positive erasing potential Vera to the n-type well 11 and the p-type well 12 and applies, for example, the ground potential to the word lines WL. At this time, the control circuit 50 applies a source potential (Vera−α) that is slightly lower than the erasing potential Vera to the source electrode 27. The erasing potential Vera is, for example, 20 V (volts); and α is, for example, 0.5 V or less, e.g., 0.2 V. Thereby, the potential of the silicon pillar 20 is a potential near the erasing potential Vera; and a voltage in which the word lines WL are negative and the silicon pillar 20 is positive is applied between the silicon pillar 20 and the word lines WL.

As a result, as illustrated by broken line A in FIG. 2, the holes that are injected into the p-type well 12 move through the p-type well 12, flow into the silicon pillar 20, pass through the tunneling insulating film 21, and are injected into the charge storage film 22. Thereby, pair annihilation occurs for the injected holes and the electrons stored inside the charge storage film 22; and the data of the memory cells is erased.

<Effects>

Effects of the embodiment will now be described.

Figure 3:
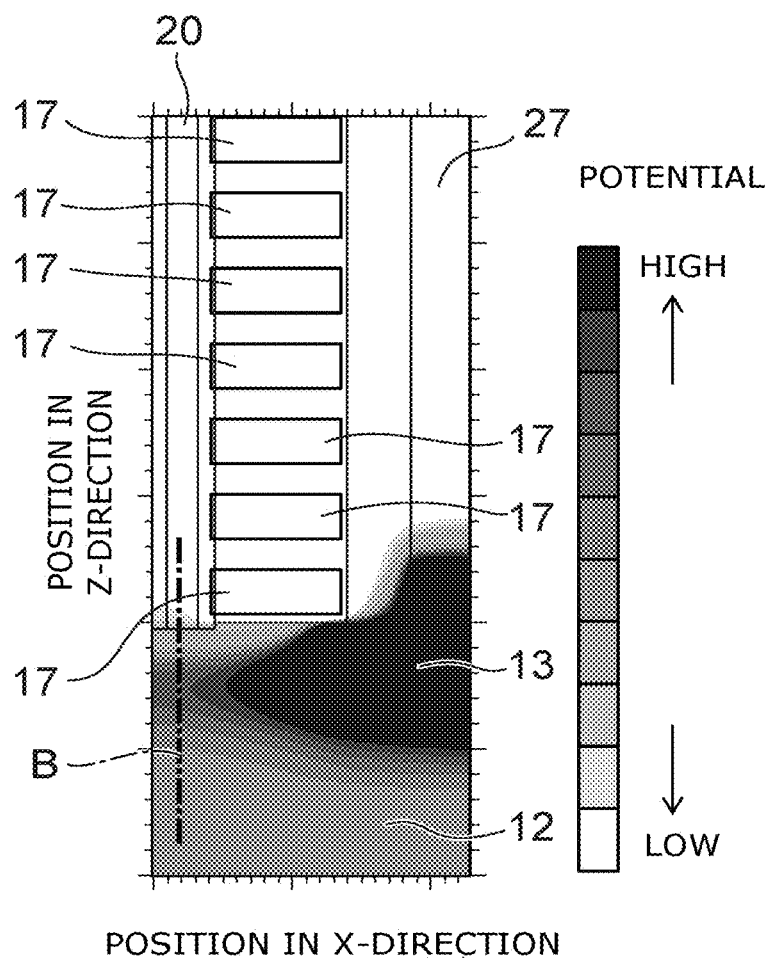
FIG. 3 is a drawing showing simulation results of a potential distribution of a source electrode, a silicon substrate, and a silicon pillar, where the horizontal axis is the position in an X-direction, and the vertical axis is the position in a Z-direction.

FIG. 3 is a drawing showing simulation results of the potential distribution of the source electrode, the silicon substrate, and the silicon pillar, where the horizontal axis is the position in the X-direction, and the vertical axis is the position in the Z-direction.

Figure 4A:
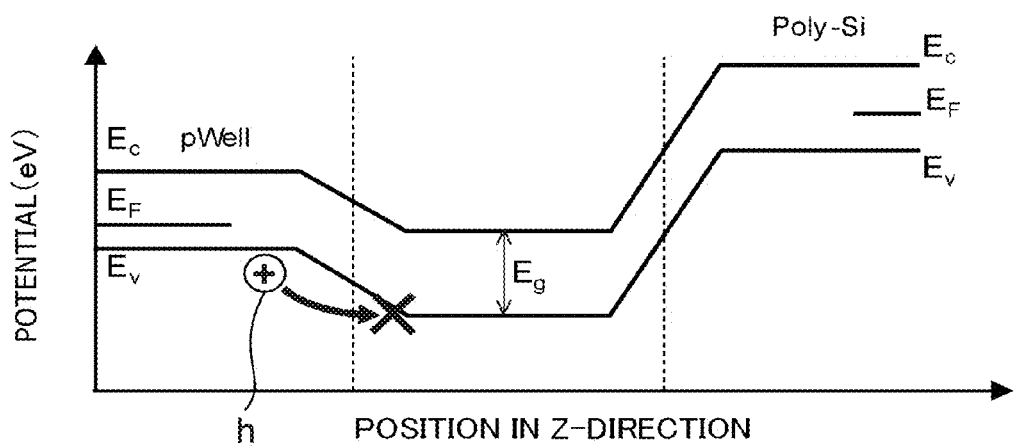
FIG. 4A and FIG. 4B are band diagrams showing a potential distribution of the silicon substrate, where the horizontal axis is the position in the Z-direction, and the vertical axis is the potential.
Figure 4B:
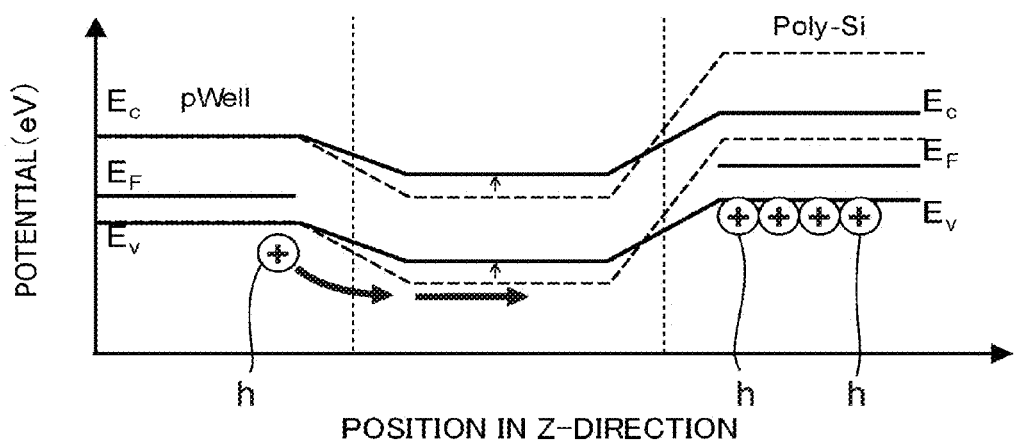

FIG. 4A and FIG. 4B are band diagrams showing the potential distribution of the silicon substrate, where the horizontal axis is the position in the Z-direction, and the vertical axis is the potential; FIG. 4A shows the case where the source potential is set to the erasing potential Vera; and FIG. 4B shows the case where the source potential is set to the potential (Vera−α). The horizontal axis of FIG. 4A and FIG. 4B corresponds to single dot-dash line B shown in FIG. 3.

As shown in FIG. 3, if the same potential as the silicon substrate 10, i.e., the erasing potential Vera, is applied to the source electrode 27, the erasing potential Vera is applied to both the p-type well 12 and the n$^+$-type diffusion layer 13. At this time, the potential of the n$^+$-type diffusion layer 13 becomes higher than the potential of the p-type well 12 because the acceptors are dominant in the p-type well 12 and the donors are dominant in the n$^+$-type diffusion layer 13. As a result, a reverse junction voltage is applied to the interface between the n$^+$-type diffusion layer 13 and the p-type well 12; and a depletion layer that has the interface as a starting point spreads. The potential of the depletion layer is about the same as the potential of the n$^+$-type diffusion layer 13.

Then, when the distance between the n$^+$-type diffusion layer 13 and the silicon pillar 20 is shortened to realize higher integration of the semiconductor memory device 1, there are cases where the depletion layer extends to the region directly under the silicon pillar 20 and undesirably covers the lower end of the silicon pillar 20. In such a case, as shown in FIG. 4A, a region that has a potential higher than the p-type well 12, which includes the n$^+$-type diffusion layer 13 and the depletion layer, becomes a potential barrier for the holes h and impedes the holes h flowing into the silicon pillar 20 from the p-type well 12. Thereby, the increase of the potential of the silicon pillar 20 is delayed; and the time necessary for the erasing operation undesirably increases. In the case where the erasing potential Vera is set to be high to realize a higher speed of the erasing operation, higher integration of the semiconductor memory device 1 is hindered in order to ensure the breakdown voltage of each portion.

Conversely, in the embodiment as shown in FIG. 2, the potential (Vera−α) that is lower than the erasing potential Vera is applied to the source electrode 27. Thereby, because the potential of the n$^+$-type diffusion layer 13 is lower than the potential of the p-type well 12, the interface between the p-type well 12 and the n$^+$-type diffusion layer 13 becomes a forward junction; and a depletion layer is not formed. As a result, as shown in FIG. 4B, the potential barrier for the holes h is low; and the holes h flow easily into the silicon pillar 20 from the p-type well 12. Thereby, the time necessary for the erasing operation decreases; and the operation speed of the semiconductor memory device 1 becomes high. Also, higher integration of the semiconductor memory device 1 is not hindered because it is unnecessary to set the erasing potential Vera to be excessively high.

To realize the erasing operation described above, it is necessary to set the source potential applied to the source electrode 27 to be higher than the word line potential applied to the word lines WL, e.g., the ground potential GND. Also, in the case where the absolute value α of the potential difference between the erasing potential Vera applied to the p-type well 12 and the source potential (Vera−α) applied to the source electrode 27 is set to be too large, the leakage current flowing in the source electrode 27 from the silicon substrate 10 becomes large. Accordingly, it is favorable for the value α to be as small as possible within the range in which the effect of reducing the potential barrier for the holes h described above is obtained. As shown in FIG. 4A and FIG. 4B, it is favorable for the absolute value α of the potential difference to be not more than a bandgap $E_g$ of silicon because the effect described above is saturated even when the value α is set to exceed the bandgap $E_g$ of silicon. Because the bandgap $E_g$ of silicon is 1.11 eV, it is favorable to set the potential difference α to be 1.11 V or less; it is favorable to set the potential difference α to be 0.5 V or less; and it is favorable to set the potential difference α to be, for example, about 0.2 V.

Thus, according to the embodiment, a semiconductor memory device having a high-speed erasing operation can be realized.

Second Embodiment

A second embodiment will now be described.

Figure 5:
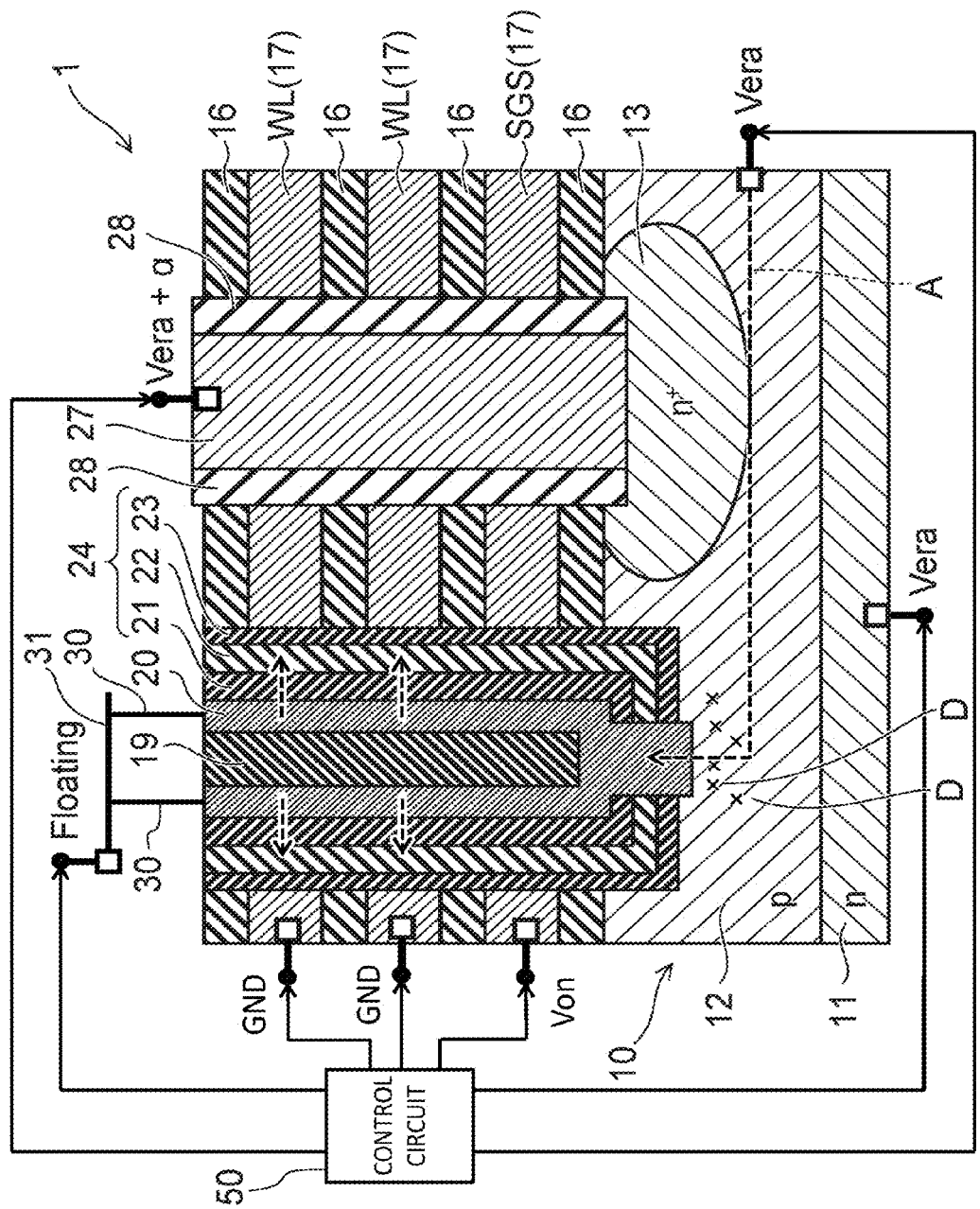
FIG. 5 is a drawing schematically showing a semiconductor memory device according to a second embodiment.

FIG. 5 is a drawing schematically showing a semiconductor memory device according to the embodiment.

Figure 6A:
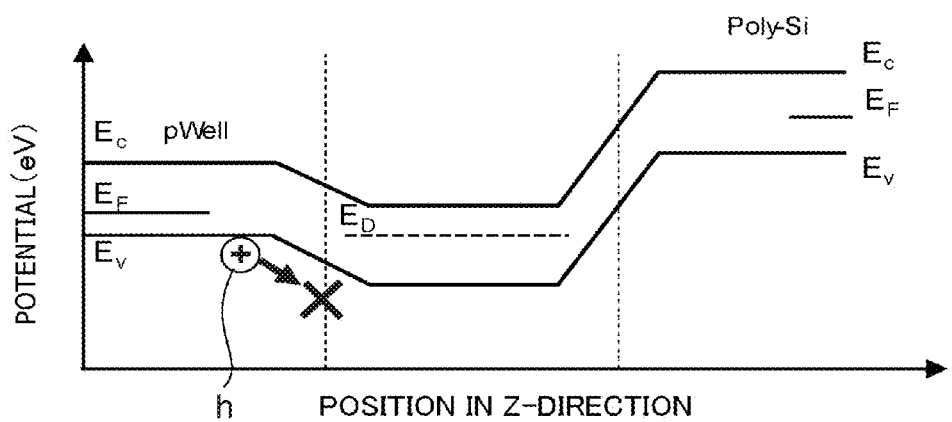
FIG. 6A and FIG. 6B are band diagrams showing the potential distribution of a silicon substrate, where the horizontal axis is the position in the Z-direction, and the vertical axis is the potential.
Figure 6B:
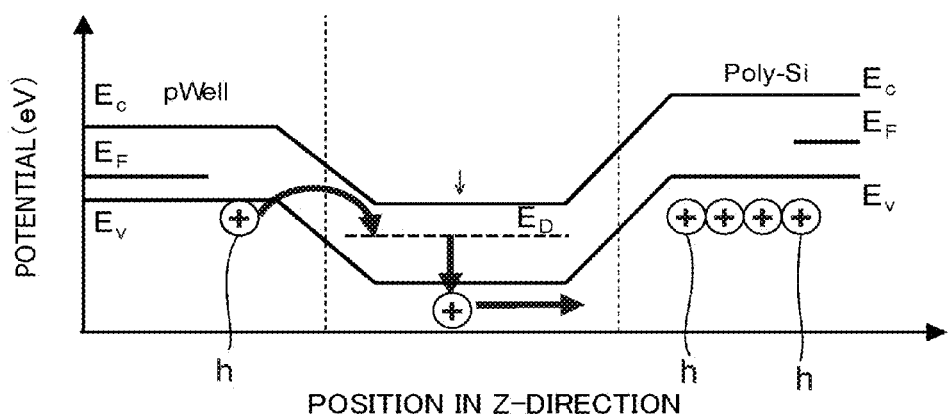

FIG. 6A and FIG. 6B are band diagrams showing the potential distribution of the silicon substrate, where the horizontal axis is the position in the Z-direction, and the vertical axis is the potential; FIG. 6A shows the case where the source potential is set to the erasing potential Vera; and FIG. 6B shows the case where the source potential is set to the potential (Vera+α).

The semiconductor memory device 2 according to the embodiment differs from the semiconductor memory device 1 according to the first embodiment described above (referring to FIG. 2) in that many defects D are introduced to the region of the silicon substrate 10 directly under the silicon pillar 20. Also, the embodiment differs in that the control circuit 50 applies the source potential (Vera+α) that is slightly higher than the erasing potential Vera to the source electrode 27 in the erasing operation.

The operations and the effects of the semiconductor memory device according to the embodiment will now be described.

The defects D are, for example, lattice defects, dislocations, etc., of the silicon substrate 10. When manufacturing the semiconductor memory device 2, the stacked body 15 is formed on the silicon substrate 10; the memory hole that extends in the Z-direction is made in the stacked body 15; the memory film 24 is formed on the inner surface of the memory hole; and the silicon pillar 20 is formed on the side surface of the memory film 24. Also, there are cases where over-etching the upper surface of the silicon substrate 10 is performed and a recess is made when making the memory hole; the recess is refilled by epitaxial growth of silicon; and the silicon pillar 20 is formed by depositing polysilicon inside the recess. At this time, the defects D occur due to the stress difference between the refilled portion and the periphery. A region $R_D$ occurs where the generation-recombination time of the holes h along the many defects D is short. As shown in FIG. 6A, the defects D have an independent energy level $E_D$.

As shown in FIG. 6A, if the same erasing potential Vera as the silicon substrate 10 is applied to the source electrode 27, as described in the first embodiment described above, the movement of the holes h is impeded by the depletion layer; and there are cases where the erasing operation is delayed.

Conversely, in the embodiment as shown in FIG. 5, the control circuit 50 applies the source potential (Vera+α) that is higher than the erasing potential Vera to the source electrode 27. Thereby, as shown in FIG. 6B, the energy level of the n⁺-type diffusion layer 13 vicinity of the silicon substrate 10 is pulled downward; and the energy level $E_D$ of the defects D also is pulled downward. As a result, the difference between the energy level that the holes h can have and the energy level $E_D$ of the defects D becomes small. Therefore, due to the quantum tunneling effect, the holes h that are conducted through the p-type well 12 move through the region $R_D$ by being conducted through the defects D, i.e., dislocations or lattice defects; and by further thermal stimulation, the potential barrier due to the depletion layer can be overcome. As a result, the holes h flow efficiently into the silicon pillar 20 from the p-type well 12; and the erasing operation can be faster. In such a case, although the value of the absolute value α of the potential difference between the source potential and the erasing potential is dependent on the energy level of the defects D, for example, the value of the absolute value α is not more than a potential difference corresponding to the bandgap $E_g$ of silicon and is, for example, 0.5 V or less.

Thus, in the case where many defects D are introduced to the region of the silicon substrate 10 directly under the silicon pillar 20, even when the source potential (Vera+α) that is higher than the erasing potential Vera is applied to the source electrode 27, the movement of the holes is promoted; and the erasing operation can be faster.

Otherwise, the configuration, the manufacturing method, the operations, and the effects of the embodiment are similar to those of the first embodiment described above.

According to the embodiments described above, a semiconductor memory device having a high erasing speed and a method for driving the semiconductor memory device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device, comprising:
    a semiconductor substrate;
    a stacked body provided on the semiconductor substrate, including insulating films and electrode films, each of the insulating films and each of the electrode films being stacked alternately in the stacked body;
    a semiconductor pillar provided inside the stacked body, the semiconductor pillar extending in a stacking direction of the insulating films and the electrode films, a lower end of the semiconductor pillar being connected to the semiconductor substrate;
    a charge storage film provided between the semiconductor pillar and one of the electrode films;
    an electrode member provided inside the stacked body, the electrode member extending in the stacking direction, a lower end of the electrode member being connected to the semiconductor substrate; and
    a control circuit setting an upper end of the semiconductor pillar to a floating state, applying a first potential to the semiconductor substrate, applying a second potential to the electrode member, and applying a third potential to the one of the electrode films, the second potential being lower than the first potential, the third potential being lower than the second potential.

2. The semiconductor memory device according to claim 1, wherein the absolute value of a difference between the first potential and the second potential is not more than a potential difference corresponding to a bandgap of a material of the semiconductor substrate.

3. The semiconductor memory device according to claim 1, wherein the control circuit implements, in an erasing operation, an operation of setting the upper end of the semiconductor pillar to the floating state, applying the first potential to the semiconductor substrate, applying the second potential to the electrode member, and applying the third potential to the one of the electrode films, the second potential being lower than the first potential, the third potential being lower than the second potential.

4. The semiconductor memory device according to claim 1, wherein the semiconductor substrate includes:
    a first portion contacting the electrode member, a conductivity type of the first portion being an n-type; and
    a second portion contacting the semiconductor pillar, a conductivity type of the second portion being a p-type.

5. The semiconductor memory device according to claim 4, wherein the second portion covers a side surface and a lower surface of the first portion.

6. The semiconductor memory device according to claim 4, wherein the semiconductor substrate further includes a third portion disposed below the second portion and separated from the first portion by the second portion, a conductivity type of the third portion being the n-type.

7. A semiconductor memory device, comprising:
a semiconductor substrate;
a stacked body provided on the semiconductor substrate, including insulating films and electrode films, each of the insulating films and each of the electrode films being stacked alternately in the stacked body;
a semiconductor pillar provided inside the stacked body, the semiconductor pillar extending in a stacking direction of the insulating films and the electrode films, a lower end of the semiconductor pillar being connected to the semiconductor substrate;
a charge storage film provided between the semiconductor pillar and one of the electrode films;
an electrode member provided inside the stacked body, the electrode member extending in the stacking direction, a lower end of the electrode member being connected to the semiconductor substrate; and
a control circuit setting an upper end of the semiconductor pillar to a floating state, applying a first potential to the semiconductor substrate, applying a second potential to the electrode member, and applying a third potential to the one of the electrode films, the second potential being higher than the first potential, the third potential being lower than the first potential.

8. The semiconductor memory device according to claim 7, wherein a defect is introduced to a region of the semiconductor substrate directly under the semiconductor pillar.

9. The semiconductor memory device according to claim 8, wherein the defect is a dislocation or a lattice defect.

10. The semiconductor memory device according to claim 7, wherein the control circuit implements, in an erasing operation, an operation of setting the upper end of the semiconductor pillar to the floating state, applying the first potential to the semiconductor substrate, applying the second potential to the electrode member, and applying the third potential to the one of the electrode films, the second potential being higher than the first potential, the third potential being lower than the first potential.

11. The semiconductor memory device according to claim 8, wherein the semiconductor substrate includes:
a first portion contacting the electrode member, the first portion being of a first conductivity type; and
a second portion contacting the semiconductor pillar, the second portion being of a second conductivity type.

12. The semiconductor memory device according to claim 11, wherein the second portion covers a side surface and a lower surface of the first portion.

13. The semiconductor memory device according to claim 11, wherein the semiconductor substrate further includes a third portion disposed below the second portion and separated from the first portion by the second portion, the third portion being of the first conductivity type.

14. A method for driving a semiconductor memory device, the semiconductor memory device having a semiconductor substrate, a stacked body provided on the semiconductor substrate, a semiconductor pillar provided inside the stacked body, a charge storage film, and an electrode member provided inside the stacked body, the stacked body including insulating films and electrode films, each of the insulating films and each of the electrode films being stacked alternately in the stacked body, the semiconductor pillar extending in a stacking direction of the insulating films and the electrode films, a lower end of the semiconductor pillar being connected to the semiconductor substrate, the electrode member extending in the stacking direction, a lower end of the electrode member being connected to the semiconductor substrate, the charge storage film being provided between the semiconductor pillar and one of the electrode films, the method for driving the semiconductor memory device comprising:
a process of setting an upper end of the semiconductor pillar to a floating state, applying a first potential to the semiconductor substrate, applying a second potential to the electrode member, and applying a third potential to the one of the electrode films, the second potential being lower than the first potential, the third potential being lower than the second potential.

15. The method for driving the semiconductor memory device according to claim 14, wherein the absolute value of a difference between the first potential and the second potential is set in the process to be not more than a potential difference corresponding to a bandgap of a material of the semiconductor substrate.

16. The method for driving the semiconductor memory device according to claim 14, wherein the process is implemented in an erasing operation.

17. A method for driving a semiconductor memory device, the semiconductor memory device having a semiconductor substrate, a stacked body provided on the semiconductor substrate, a semiconductor pillar provided inside the stacked body, a charge storage film, and an electrode member provided inside the stacked body, the stacked body including insulating films and electrode films, each of the insulating films and each of the electrode films being stacked alternately in the stacked body, the semiconductor pillar extending in a stacking direction of the insulating films and the electrode films, a lower end of the semiconductor pillar being connected to the semiconductor substrate, the electrode member extending in the stacking direction, a lower end of the electrode member being connected to the semiconductor substrate, the charge storage film being provided between the semiconductor pillar and one of the electrode films, the method for driving the semiconductor memory device comprising:
a process of setting an upper end of the semiconductor pillar to a floating state, applying a first potential to the semiconductor substrate, applying a second potential to the electrode member, and applying a third potential to the one of the electrode films, the second potential being higher than the first potential, the third potential being lower than the first potential.

18. The method for driving the semiconductor memory device according to claim 17, wherein a defect is introduced to a region of the semiconductor substrate directly under the semiconductor pillar.

19. The method for driving the semiconductor memory device according to claim 18, wherein the defect is a dislocation or a lattice defect.

20. The method for driving the semiconductor memory device according to claim 17, wherein the process is implemented in an erasing operation.

* * * * *